US012811600B2

(12) United States Patent
Vargas et al.

(10) Patent No.: US 12,811,600 B2
(45) Date of Patent: Nov. 24, 2026

(54) CELL PROGRAMMING FOR DIGITAL-TO-ANALOG CONVERTER

(71) Applicant: Apple Inc., Cupertino, CA (US)

(72) Inventors: Adrien Vargas, Munich (DE); Antonio Passamani, Munich (DE); Dimo Martev, Munich (DE); Jakob Tomasik, Hallbergmoos (DE); Timo W Gossmann, Neubiberg (DE)

(73) Assignee: Apple Inc., Cupertino, CA (US)

( * ) Notice: Subject to any disclaimer, the term of this patent is extended or adjusted under 35 U.S.C. 154(b) by 135 days.

(21) Appl. No.: 18/897,739

(22) Filed: Sep. 26, 2024

(65) Prior Publication Data

US 2026/0088826 A1 Mar. 26, 2026

(51) Int. Cl.
*H03M 1/66* (2006.01)

(52) U.S. Cl.
CPC .................................... *H03M 1/66* (2013.01)

(58) Field of Classification Search
CPC ............ H03M 7/3059; H03M 7/6005; H03M 7/3079; H03M 7/405; G06N 20/00; G06N 5/01; G06F 16/1752
See application file for complete search history.

(56) References Cited

U.S. PATENT DOCUMENTS 8,779,953 B1 7/2014 Portmann et al.
9,564,913 B1 2/2017 Courcy
9,590,648 B2 3/2017 La Grou
9,813,071 B1 * 11/2017 An ...................... H03M 1/0617
10,601,437 B1 * 3/2020 Kuttner .................... H04B 1/04
10,608,661 B1 * 3/2020 Gruber ..................... H03H 7/42
10,748,079 B2 8/2020 Boothby
10,965,299 B1 * 3/2021 Kim ........................ G06F 7/588
11,336,293 B1 * 5/2022 Passamani .............. H03M 1/66
11,489,534 B1 * 11/2022 Lee ......................... H03M 1/68
11,870,473 B1 * 1/2024 Tabarani ................. H03M 1/74
12,537,538 B2 * 1/2026 Westra ................ H03M 1/1014
2007/0263017 A1 * 11/2007 Umeda ................ G09G 3/3611 345/691
2011/0255876 A1 * 10/2011 Sugihara ............ H04B 10/5055 398/188
2014/0328429 A1 * 11/2014 Kuttner ................... H03M 1/66 375/295
2015/0194191 A1 * 7/2015 Luthra ............... G11C 13/0002 365/191

(Continued)

FOREIGN PATENT DOCUMENTS

CN 103023506 B 8/2016
CN 209785555 U 12/2019

(Continued)

*Primary Examiner* — Lam T Mai
(74) *Attorney, Agent, or Firm* — Treyz Law Group, P.C.; Tianyi He

(57) ABSTRACT

An electronic device may include a digital-to-analog converter containing programmable features in corresponding unit cells of the digital-to-analog converter. Programming data can be written into an appropriate unit cell using an address and a strobe signal. If desired, a read flag and a read data path may be provided to read data out of the appropriate unit cell. The digital-to-analog converter may include address decoding circuitry at each unit cell and/or shared between multiple unit cells.

20 Claims, 9 Drawing Sheets

(56) References Cited

U.S. PATENT DOCUMENTS

| | | | | |
|---|---|---|---|---|
| 2016/0094235 | A1* | 3/2016 | Kuttner | H03M 1/662 341/144 |
| 2016/0134302 | A1* | 5/2016 | Schafferer | H03M 3/458 341/120 |
| 2021/0367630 | A1* | 11/2021 | Cho | H04B 1/0483 |
| 2022/0094368 | A1* | 3/2022 | Passamani | H04B 1/04 |
| 2022/0109460 | A1* | 4/2022 | Liu | H03M 1/0863 |
| 2022/0345148 | A1* | 10/2022 | Molina | H03M 1/0626 |
| 2023/0208430 | A1* | 6/2023 | Kundu | H03M 1/742 341/120 |
| 2023/0412188 | A1* | 12/2023 | Passamani | H03M 1/0665 |
| 2023/0412189 | A1* | 12/2023 | Passamani | H03M 1/0665 |
| 2024/0028060 | A1* | 1/2024 | Passamani | G05F 1/575 |
| 2024/0030929 | A1* | 1/2024 | Tabarani | H03F 3/19 |
| 2024/0063809 | A1* | 2/2024 | Mulder | H03M 1/1042 |
| 2024/0072815 | A1* | 2/2024 | Passamani | H03M 1/662 |
| 2024/0072829 | A1* | 2/2024 | Passamani | H04B 1/04 |
| 2024/0103550 | A1* | 3/2024 | Gourlat | G05F 3/26 |
| 2024/0248504 | A1* | 7/2024 | Vargas | G05F 1/56 |
| 2024/0275394 | A1* | 8/2024 | Passamani | H03M 1/06 |
| 2025/0021121 | A1* | 1/2025 | Vargas | H03K 19/173 |
| 2025/0035688 | A1* | 1/2025 | Gossmann | G01D 5/24 |

FOREIGN PATENT DOCUMENTS

| | | | |
|---|---|---|---|
| CN | 109586724 | B | 4/2020 |
| CN | 109586726 | B | 3/2024 |
| EP | 3217556 | B1 | 1/2019 |
| EP | 3537608 | B1 | 12/2023 |
| WO | 2018132743 | A1 | 7/2018 |

* cited by examiner

CELL PROGRAMMING FOR DIGITAL-TO-ANALOG CONVERTER

FIELD

This disclosure relates generally to electronic devices such as electronic devices with digital-to-analog converters.

BACKGROUND

Electronic devices are often provided with wireless communications capabilities. An electronic device with wireless communications capabilities has wireless communications circuitry. Wireless communications circuitry can include a digital-to-analog converter. It may be desirable to program the digital-to-analog converter to operate in the appropriate manner when converting digital data into analog voltage(s). It can be challenging to facilitate programming of the digital-to-analog converter, especially when a large number of fine granularity features are to be programmed in the digital-to-analog converter.

SUMMARY

An electronic device may include a digital-to-analog converter containing programmable features such as configurable circuits in corresponding unit cells of the digital-to-analog converter. Programming data conveyed on a write data path can be written into an appropriate unit cell using an address and a strobe signal. If desired, a read flag and a data read path may be provided to read data out of the appropriate unit cell. The digital-to-analog converter may include (address) decoding circuitry at each unit cell and/or shared between multiple unit cells.

An aspect of the disclosure provides wireless communications circuitry. The wireless communications circuitry can include a digital-to-analog converter having a plurality of unit cells, programming circuitry configured to program the plurality of unit cells, and a plurality of data paths coupled to the programming circuitry and to the digital-to-analog converter and including address data paths. The programming circuitry can be configured to convey, over the address data paths and to the digital-to-analog converter, address bits that collectively form an address identifying a given unit cell in the plurality of unit cells.

An aspect of the disclosure provides a digital-to-analog converter. The digital-to-analog converter can include a plurality of unit cells. A given unit cell in the plurality of unit cells can have a programmable feature and a storage circuit configured to store programming data for the programmable feature. The digital-to-analog converter can include a plurality of address data paths coupled to the plurality of unit cells and configured to convey an address for the given unit cell, a strobe signal path coupled to the plurality of unit cells and configured to convey a strobe signal, and a write data path coupled to the plurality of unit cells and configured to provide the programming data to the storage circuit based on the address and the strobe signal.

An aspect of the disclosure provides a digital-to-analog converter. The digital-to-analog converter can include a plurality of unit cells each having a configurable circuit, an input coupled to the plurality of unit cells and configured to receive digital data, an output coupled to the plurality of unit cells and configured to provide an analog voltage corresponding to the digital data using the plurality of unit cells, and a plurality of programming inputs coupled to the plurality of unit cells and configured to receive an address and programming data for controlling the configurable circuit of a unit cell in the plurality of unit cells identified by the address.

DETAILED DESCRIPTION

An electronic device may include one or more digital-to-analog converters (DACs). In illustrative configurations sometimes described herein as an example, one or more DACs may be provided as part of wireless communications circuitry (e.g., formed as part of transmitter circuitry, interfacing between digital baseband circuitry and analog radio-frequency circuitry). To facilitate the desired conversion operations, a DAC may include feature(s) to be programmed in each unit cell. Given the large number of cells and corresponding features to be programmed, it may be challenging to route the same large number of lines to each unit cell for providing programming data for the feature(s) in each unit cell.

To better facilitate programming of these unit cells (e.g., features therein), DAC programming circuitry can convey programming data along with a corresponding address, a strobe signal to the DAC. If desired, the DAC may also provide a read flag and a corresponding read path (for reading data out of a unit cell). The conveyed information (including the programming data, the address, the strobe signal, and the read flag) may be processed by the DAC such that the programming data is written into the appropriate cell(s) for the appropriate feature(s) (e.g., as indicated by the address) during a write operation and/or corresponding data is read out of the appropriate cell (e.g., as indicated by the address) during a read operation. The DAC may include address decoding circuitry locally at each unit cell and/or shared address decoding circuitry at splits between (e.g., that branch out to) multiple cells. An illustrative electronic device, in which DAC circuitry (e.g., the DAC and the programming circuitry configured in the illustrative manners described above) can be employed, is shown in FIG. 1.

Figure 1:
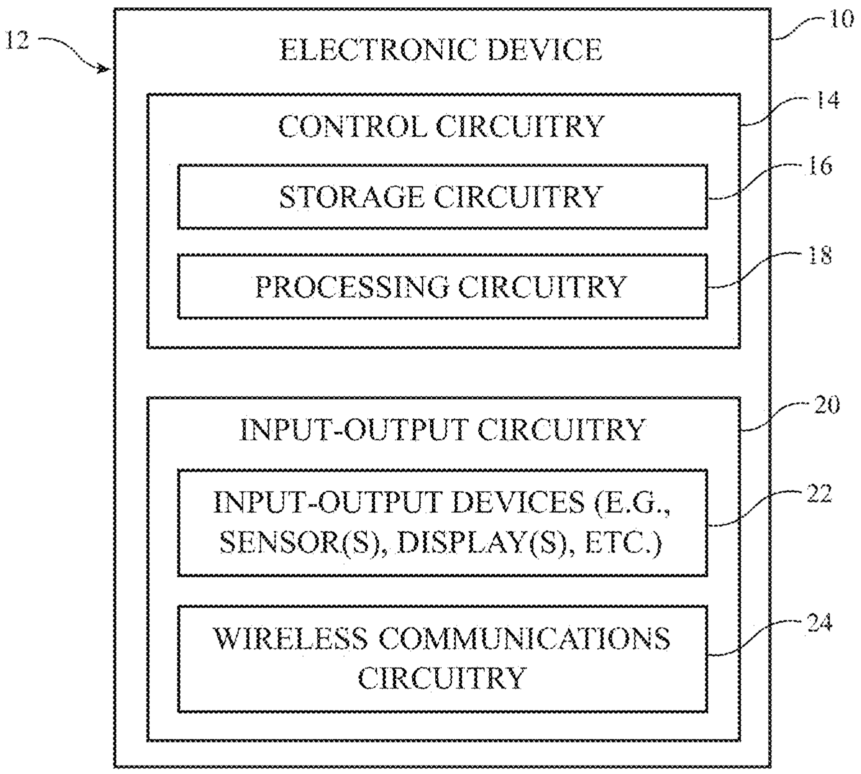
FIG. 1 is a diagram of an illustrative electronic device having wireless communications circuitry in accordance with some embodiments.

FIG. 1 is a diagram of an illustrative electronic device such as electronic device 10. Electronic device 10 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18 (e.g., one or more processors 18). Processing circuitry 18 may be used to control the operation of device 10. Processing circuitry 18 may include one or more microprocessors, microcontrollers, digital signal processors, host processors, baseband processor integrated circuits, application processors, application specific integrated circuits, central processing units (CPUs), general purpose processors, or other types of processors. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G New Radio (NR) protocols, etc.), MIMO protocols, antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, electronic pencil (e.g., a stylus), and joysticks, and other input-output devices may be coupled to device 10 using wired or wireless connections (e.g., some of input-output devices 22 may be peripherals that are coupled to a main processing unit or other portion of device 10 via a wired or wireless link).

Figure 2:
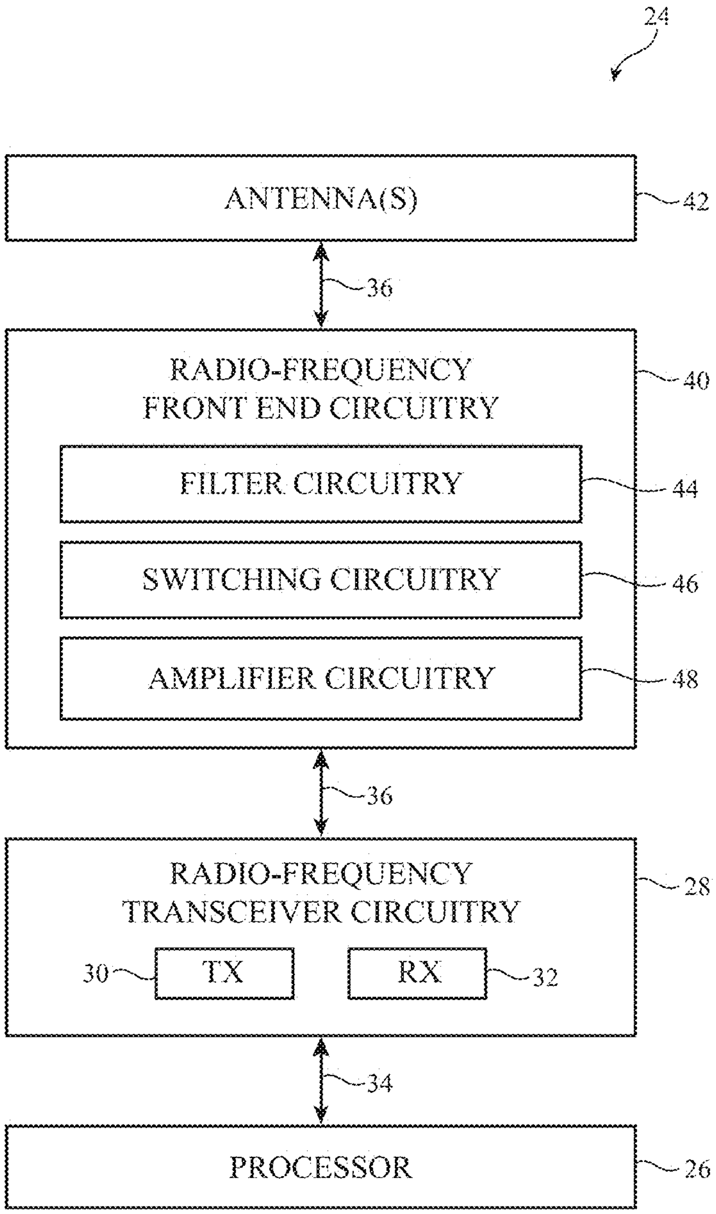
FIG. 2 is a diagram of illustrative wireless communications circuitry in accordance with some embodiments.

Input-output circuitry 20 may include wireless communications circuitry such as wireless communications circuitry 24 (sometimes referred to herein as wireless circuitry 24) for wirelessly conveying radio-frequency signals. FIG. 2 is a diagram showing illustrative components within wireless circuitry 24. As shown in FIG. 2, wireless circuitry 24 may include one or more processors such as processor 26, radio-frequency (RF) transceiver circuitry such as radio-frequency transceiver circuitry 28, radio-frequency front end circuitry such as radio-frequency front end circuitry 40 (which, when integrated, may sometimes be referred to as front end module 40), and one or more antennas such as antenna(s) 42. Processor 26 may be a baseband processor, application processor, general purpose processor, microprocessor, microcontroller, digital signal processor, host processor, or other type of processor. If desired, processor 26 may be implemented as part of control circuitry 14. Processor 26 may be communicatively coupled to transceiver circuitry 28 over path 34. Transceiver circuitry 28 may be communicatively coupled to antenna(s) 42 via radio-frequency transmission line path(s) 36. Radio-frequency front end circuitry 40 may be disposed along (e.g., on) radio-frequency transmission line path(s) 36 between transceiver circuitry 28 and antenna(s) 42.

In the example of FIG. 2, wireless circuitry 24 is illustrated as including a single processor 26, a single instance of transceiver circuitry 28, a single instance of front end circuitry 40, and a single set of antenna(s) 42 for the sake of clarity. In general, wireless circuitry 24 may include any number of processors 26, any number of instances of transceiver circuitry 28, any number of instances of front end circuitry 40, and any number of sets of antenna(s) 42. Each processor 26 may be communicatively coupled to one or more transceivers (e.g., instances of transceiver circuitry 28) over respective paths 34. Each transceiver 28 may include a transmitter circuit 30 configured to output uplink signals to antenna(s) 42, may include a receiver circuit 32 configured to receive downlink signals from antenna(s) 42, and may be communicatively coupled to one or more antennas 42 over respective radio-frequency transmission line paths 36. Each radio-frequency transmission line path 36 may have respective front end circuitry 40 disposed thereon. If desired, two or more instances of (different types of) front end circuitry 40 may be disposed on the same radio-frequency transmission line path 36. If desired, one or more of the radio-frequency transmission line paths 36 in wireless circuitry 24 may be implemented without any front end circuitry 40 disposed thereon.

Antenna(s) 42 may be formed using any desired antenna structures. For example, antenna(s) 42 may each be an antenna with an antenna resonating element that is formed from loop antenna structures, patch antenna structures, inverted-F antenna structures, slot antenna structures, planar inverted-F antenna structures, helical antenna structures, monopole antennas, dipole antennas, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

Each radio-frequency transmission line path 36 may be communicatively coupled to an antenna feed on antenna 42. The antenna feed may, for example, include a positive antenna feed terminal and a ground antenna feed terminal. Radio-frequency transmission line path 36 may have a positive transmission line signal path that is communicatively coupled to the positive antenna feed terminal on antenna 42. Radio-frequency transmission line path 36 may have a ground transmission line signal path that is communicatively coupled to the ground antenna feed terminal on antenna 42. This example is merely illustrative and, in general, antennas 42 may be fed using any desired antenna feeding scheme. If desired, antenna 42 may have multiple antenna feeds that are communicatively coupled to one or more radio-frequency transmission line paths 36.

Radio-frequency transmission line path 36 may include transmission lines that are used to route radio-frequency signals within device 10 (FIG. 1). These transmission lines may include coaxial cables, microstrip transmission lines, stripline transmission lines, edge-coupled microstrip transmission lines, edge-coupled stripline transmission lines, transmission lines formed from combinations of transmission lines of these types, etc. If desired, transmission lines in radio-frequency transmission line paths 36 may be integrated into rigid printed circuit boards and/or flexible printed circuit substrates.

In performing wireless signal transmission, processor(s) 26 may provide transmit signals (e.g., digital or baseband signals) to transceiver circuitry 28 over path 34. Transceiver circuitry 28 may further include circuitry for converting the transmit (baseband) signals received from processor 26 into corresponding radio-frequency signals. For example, transceiver circuitry 28 may include mixer circuitry for up-converting (or modulating) the transmit (baseband) signals to radio-frequencies prior to transmission over antenna 42. The example of FIG. 2 in which processor 26 communicates with transceiver circuitry 28 is merely illustrative. In general, transceiver circuitry 28 may communicate with a baseband processor, an application processor, general purpose processor, a microcontroller, a microprocessor, or one or more processors within circuitry 18 (e.g., implementing the functions of processor 26). Transceiver circuitry 28 may also include digital-to-analog converter (DAC) and/or analog-to-digital converter (ADC) circuitry for converting signals between digital and analog domains. Transceiver circuitry 28 may use transmitter (TX) 30 to transmit the radio-frequency signals over antenna(s) 42 via radio-frequency transmission line path 36 and front end circuitry 40. Antenna(s) 42 may transmit the radio-frequency signals to external wireless equipment by radiating the radio-frequency signals into free space.

In performing wireless reception, antenna(s) 42 may receive radio-frequency signals from the external wireless equipment. The received radio-frequency signals may be conveyed to transceiver circuitry 28 via radio-frequency transmission line path 36 and front end circuitry 40. Transceiver circuitry 28 may include circuitry such as receiver (RX) 32 for receiving signals from front end circuitry 40 and for converting the received radio-frequency signals into corresponding baseband signals. For example, transceiver circuitry 28 may include mixer circuitry for down-converting (or demodulating) the received radio-frequency signals to baseband frequencies prior to conveying the received signals to processor 26 (or control circuitry 18 implementing the function of processor 26) over path 34.

Radio-frequency front end circuitry 40 may operate on the radio-frequency signals conveyed (transmitted and/or received) over radio-frequency transmission line path 36. Front end circuitry 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits and/or one or more low-noise amplifier circuits), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed along (e.g., on) radio-frequency transmission line path 36, may be incorporated into a front end module, and/or may be incorporated into antenna 42 (e.g., to support antenna tuning, to support operation in desired frequency bands, etc.). At least some of these components may form antenna tuning components that are adjusted (e.g., using control circuitry 14) to adjust the frequency response and wireless performance of antenna 42 over time.

While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, processor 26 and/or portions of transceiver circuitry 28 (e.g., a host processor on transceiver circuitry 28) may form a part of control circuitry 14. Control circuitry 14 (e.g., portions of control circuitry 14 formed on processor 26, portions of control circuitry 14 formed on transceiver circuitry 28, and/or portions of control circuitry 14 that are separate from wireless circuitry 24) may provide control signals (e.g., over one or more control paths in device 10) that control the operation of front end circuitry 40.

Transceiver circuitry 28 may be separate from front end circuitry 40. For example, transceiver circuitry 28 may be formed on another substrate such as the main logic board of device 10, a rigid printed circuit board, or flexible printed circuit different than the one on which front end circuitry 40 is provided.

Radio-frequency transceiver circuitry 28 (and other portions wireless circuitry 24 such as front end circuitry 40) may handle transmission and/or reception of radio-frequency signals in various radio-frequency communications bands. For example, radio-frequency transceiver circuitry 28 (and other portions wireless circuitry 24 such as front end circuitry 40) may handle radio-frequency signals in wireless local area network (WLAN) communications bands such as the 2.4 GHz and 5 GHz Wi-Fi® (IEEE 802.11) bands, wireless personal area network (WPAN) communications bands such as the 2.4 GHz Bluetooth® communications band, cellular telephone communications bands such as a cellular low band (LB) (e.g., 600 to 960 MHz), a cellular low-midband (LMB) (e.g., 1400 to 1550 MHz), a cellular midband (MB) (e.g., from 1700 to 2200 MHz), a cellular high band (HB) (e.g., from 2300 to 2700 MHz), a cellular ultra-high band (UHB) (e.g., from 3300 to 5000 MHz), or other cellular communications bands between about 600 MHz and about 5000 MHz (e.g., 3G bands, 4G LTE bands, 5G New Radio Frequency Range 1 (FR1) bands below 10 GHz, 5G New Radio Frequency Range 2 (FR2) bands at millimeter and centimeter wavelengths between 20 and 60 GHz, etc.), a near-field communications (NFC) band (e.g., at 13.56 MHz), satellite navigations bands (e.g., an L1 global positioning system (GPS) band at 1575 MHz, an L5 GPS band at 1176 MHz, a Global Navigation Satellite System (GLONASS) band, a BeiDou Navigation Satellite System (BDS) band, etc.), an ultra-wideband (UWB) communications band supported by the IEEE 802.15.4 protocol and/or other UWB communications protocols (e.g., a first UWB communications band at 6.5 GHz and/or a second UWB communications band at 8.0 GHz), and/or any other desired communications bands. The communications bands handled (e.g., covered) by radio-frequency transceiver circuitry 28 (and other portions wireless circuitry 24 such as front end circuitry 40) may sometimes be referred to herein as frequency bands or simply as "bands," and may span corresponding ranges of frequencies.

Figure 3:
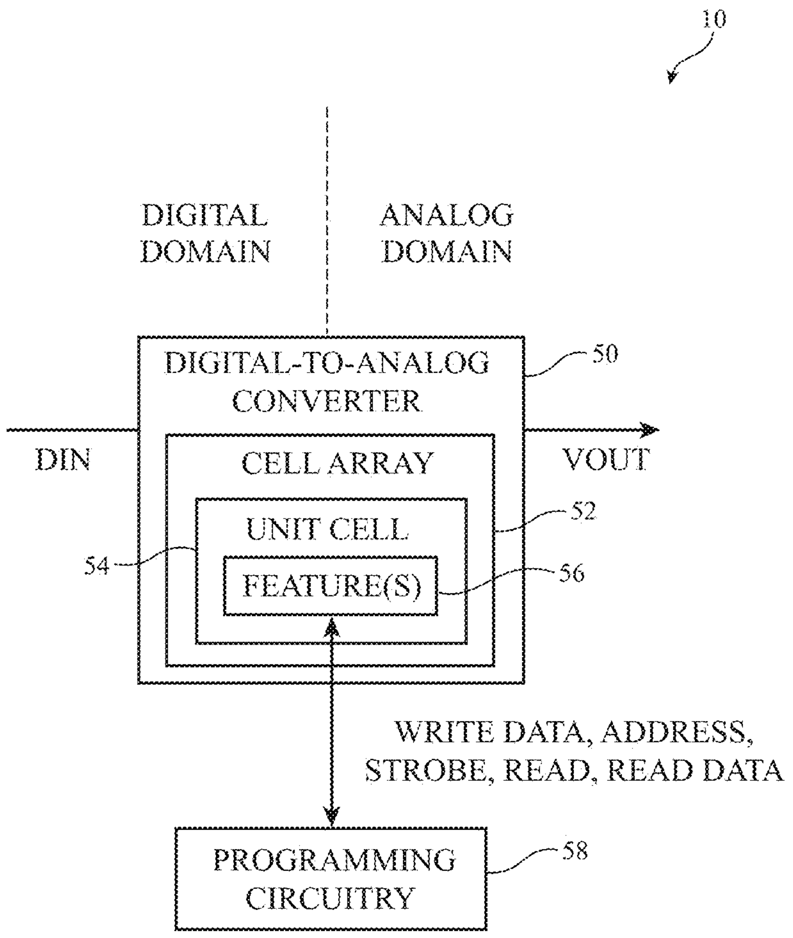
FIG. 3 is a diagram of illustrative digital-to-analog converter circuitry in accordance with some embodiments.

Electronic device 10 (FIG. 1) may include first circuitry operating in a digital domain and second circuitry operating in an analog domain. To interface between the first and second circuitry, or more specifically to perform operations in the analog domain based on operations in the digital domain, electronic device 10 may include one or more digital-to-analog converters (DACs). Illustrative DAC circuitry including a DAC 50 is shown in FIG. 3. In particular, DAC 50 may include an input DIN configured to receive digital data (e.g., from circuitry in the digital domain) containing any number of bits, values of which collectively indicate a corresponding digital data value. DAC 50 may convert the received digital data value into a corresponding analog voltage value provided at output VOUT of DAC 50 (e.g., to circuitry in the analog domain). The analog voltage values may be reference voltage levels corresponding to different input digital data values indicated by different combinations of digital data bit values.

The conversion operation performed by DAC 50 may utilize a cell array 52 containing any suitable number of unit cells 54 (sometimes referred to as cells 54). Each unit cell 54 may include a combination of circuit elements such as resistor(s), capacitor(s), inductor(s), transistor(s) (e.g., switches), and/or combinational logic circuit(s) (e.g., logic gate(s)). In some illustrative configurations sometimes described herein as an example, DAC 50 may be a capacitive DAC and each unit cell 54 may include one or more capacitors (e.g., combinations of which form one or more capacitor banks). Based on the configuration of its circuit elements, each unit cell 54 may produce, based on the digital data value (e.g., one or more bits of the digital data value), a voltage (or current) that, collectively with one or more other unit cells 54, provides or otherwise causes the final analog voltage value provided at output VOUT.

In some illustrative configurations described herein as an example, the DAC circuitry of FIG. 3, including DAC 50, may be provided as part of wireless communications circuitry 24 in FIG. 2. For example, radio-frequency transceiver circuitry 28, or more specifically transmitter 30, may include DAC 50. In particular, DAC 50 may be disposed between the (digital baseband) processor(s) 26 and corresponding analog radio-frequency processing (e.g., filtering, switching, amplifying) stages in transmitter 30 and front end circuitry 40. In other words, input DIN of DAC 50 may be communicatively coupled to digital baseband portions of processor(s) 26 and output VOUT of DAC 50 may be communicatively coupled to analog signal processing portions of transmitter 30 and/or front end circuitry 40. If desired, DAC 50 may be provided elsewhere in wireless circuitry 24 to provide digital to analog conversion functions. If desired, DAC 50 may be provided elsewhere in device 10 (e.g., outside of wireless circuitry 24).

To provide and/or enhance the conversion functionality of DAC 50, each unit cell 54 may include one or more circuit feature(s) 56 (sometimes referred to as circuit(s) 56) that are each programmable (e.g., configurable between different states depending on the stored programming data). The differently programmed circuits 56 may provide different properties for the conversion functionality of DAC 50 (e.g., cause DAC 50 to convert the same digital data value at input DIN into (slightly) different analog voltage values). In such a manner, a set of programmed states may be used to enhance the conversion functionality of DAC 50 (e.g., by providing a more accurate analog voltage value for an input digital data value).

As examples, circuit feature(s) 56 for a given cell 54 may include configurable circuit(s) that enable or disable the entire cell, that enable or disable portion(s) or certain circuit element(s) of the cell, that adjust (e.g., tune) the properties of circuit elements in the cell (e.g., adjust the resistance of a resistor, adjust the capacitance of a capacitor, adjust the inductance of an inductor, adjust a bias voltage or current of a transistor, etc.) and/or that generally connect or disconnect paths within the cell. Illustrative configurations in which these configurable circuits each rely on a corresponding control input (e.g., a control bit) to switch the configurable circuit between two or more states (e.g., between enabled and disabled states, between connected and disconnected states, between a plurality of states corresponding to values for corresponding properties, etc.) are sometimes described herein as an example. These control bits for controlling the states of configurable circuits 56 (features 56) are sometimes referred to herein as programming bits. Each cell 54 may store programming bit(s) (e.g., a bit value for a corresponding programming bit) that program (e.g., control, cause, etc.) the corresponding configurable circuit(s) 56 to each exhibit a particular (programmed) state.

In some instances, for all features in all cells, a DAC may be configured to receive a programming bit via a corresponding dedicated routing path (e.g., from external programming circuitry to the corresponding cell). However, as the number of cells and/or programmable features within each cell in the DAC increases, the number of routing paths for routing the programming bits to each cell also increases. For example, in a scenario where the DAC includes 256 cells each with a programmable feature, 256 routing paths will be provided to route the programming data to each of the 256 cells. It may be impractical and undesirable to allocate such a large area for providing all of these routing paths. This therefore limits the number of cells and/or the number of features that can be implemented in the DAC, undesirably limiting the functionality of the DAC.

To overcome these limitations and/or impart other advantages (e.g., provide a scalable programmable DAC architecture), the DAC circuitry of FIG. 3 may be provided with programming circuitry 58 (sometimes referred to as programming interface circuitry 58 or DAC programming circuitry 58) communicatively coupled to DAC 50 (e.g., at corresponding programming inputs and/or programming outputs of DAC 50). Instead of being coupled to each cell 54 of DAC 50 via at least one programming data path, thereby requiring a large number of programming data paths (each for a given cell), programming circuitry 58 may be communicatively coupled to cell array 52 via paths for programming (write) data, for an address, for a strobe signal, for a read flag, and for read data. Corresponding programming inputs and/or outputs of DAC 50 may be coupled externally to programming circuitry 58 via these paths and/or may be internally to cell array 52 via these paths. The number of programming (write) data paths may correspond to (e.g., be greater than or equal to) a number of features implemented on a given cell 54 (e.g., the cell(s) 54 having the greatest number of features in cell array 52). The number of address data paths for conveying address bits may correspond to (e.g., be greater than or equal to) a number of bits needed to uniquely address each cell 54 in array 52. The strobe signal path and the read flag path may each be a single-bit path. Any suitable number (e.g., one or more) of read data paths may be provided to access desired data (e.g., programmed data and/or other data) in the given cell 54.

Figure 4:
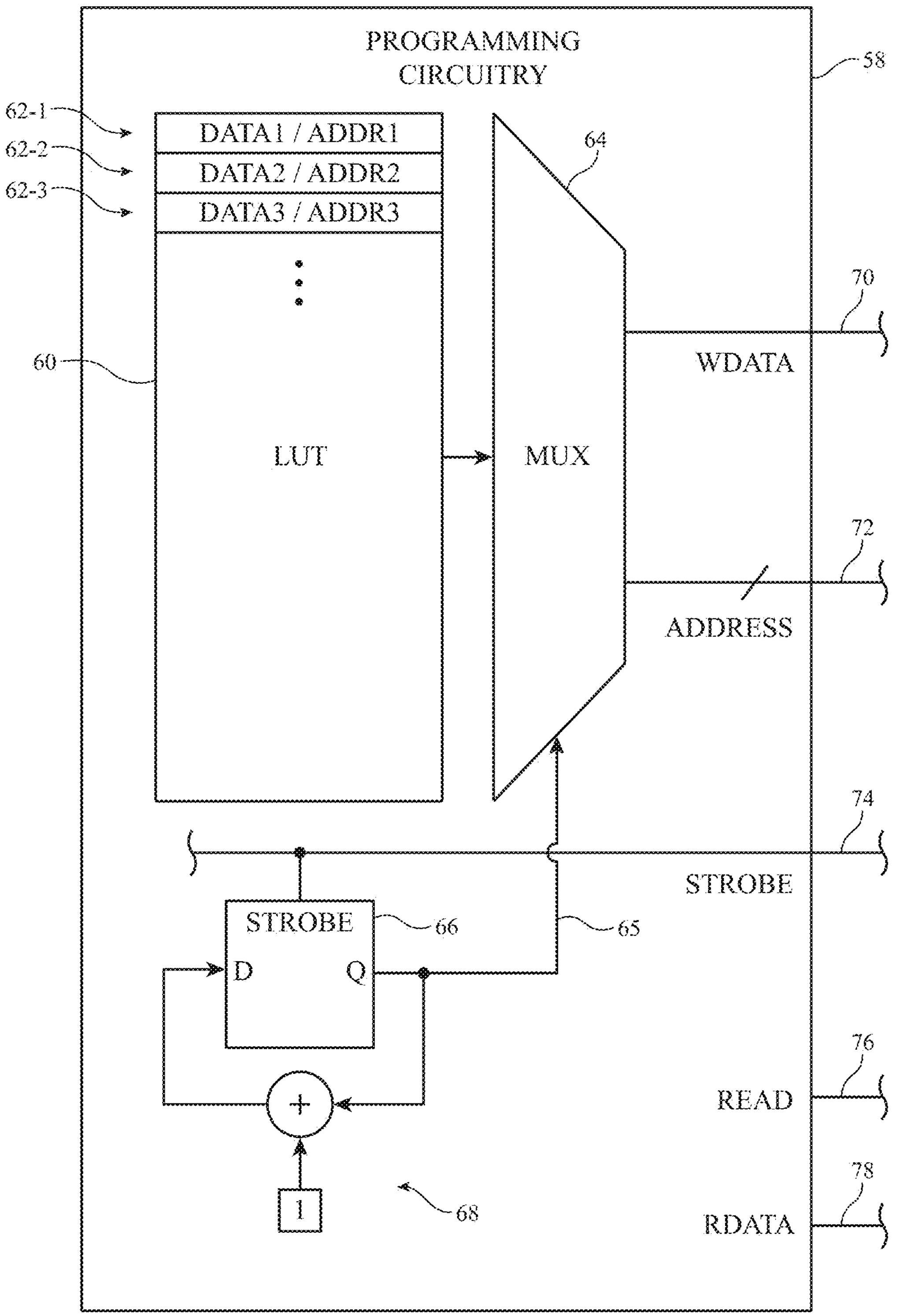
FIG. 4 is a diagram of illustrative programming circuitry for a digital-to-analog converter in accordance with some embodiments.

FIG. 4 is a diagram of illustrative DAC programming circuitry (e.g., usable to implement programming circuitry 58 in FIG. 3). In the example of FIG. 4, programming circuitry 58 may include data storage circuitry implementing (e.g., storing entries for) a lookup table 60. Lookup table 60 may include entries such as entries 62-1, 62-2, 62-3, etc., each containing programming data and an address associated with the programming data (e.g., for programming the feature(s) of the cell 54 identified by the address). Multiplexing circuitry 64 (sometimes referred to as multiplexer 64) communicatively coupled to the data storage circuitry (providing table 60) may select the corresponding entry 62 (e.g., entry 62-1) to transmit based on its control input communicatively coupled to path 65. Multiplexing circuitry 64 may transmit the programming data (e.g., DATA1) in the entry 62 along one or more (programming data) paths 70 for write data (WDATA) to be written into the appropriate cell and may transmit the address (bits) (e.g., ADDR1) along address data paths 72. When the data on path 70 and the data on path 72 have settled, programming circuitry 58 may transmit an (asserted) strobe signal along strobe signal path 74 such that the appropriate cell (e.g., indicated based on the address data on paths 72) can latch the transmitted data on path 70.

Path 74 may be communicatively coupled to latch(es) 66 and provide the asserted strobe signal to latch(es) 66 to increment the output value using an increment circuit 68 communicatively coupled between output Q and input D of latch(es) 66. Accordingly, output Q of latch(es) 66 communicatively coupled to path 65 may subsequently provide an incremented value to the control input of multiplexing circuitry 64, thereby allowing the content of the next entry 62 (e.g., programming data DATA2 and address ADDR2 of entry 62-2) to be transmitted along paths 70 and 72 (along with the next asserted strobe signal on path 74). In such a manner, programming data in each entry 62 may be iteratively programmed in the cell matching the address in the corresponding entry 62.

To facilitate cell read operations, programming circuitry 58 may additionally provide a read flag (e.g., a read bit) along data path 76 and a read data path 78 on which read data can be obtained. In particular, when the address for the cell to be read is provided on path 72 and the read flag on path 76 is set, the data from the corresponding cell may be accessible on read data path 78. Accordingly, programming circuitry 58 may store the data read from path 78 and/or otherwise use the read data on path 78. The read data may include any suitable (digital) data configured to be accessed from the cell (e.g., stored programming data).

Programming circuitry 58 may provide multiple write data paths 70 (e.g., for (simultaneously) providing multiple programming bits for the same feature or for different features in the addressed cell). Similarly, programming circuitry 58 may provide multiple read data paths 78 (e.g., for (simultaneously) reading multiple bits from the addressed cell).

The use of lookup table 60 and the process of iteratively writing programming data into cells based on entries 62 in lookup table 60 as described above are merely illustrative. If desired, DAC programming circuitry 58 may obtain programming data and an address for the cell to be programmed in any suitable manner (e.g., from control circuitry 14 in FIG. 1 as commands from processing circuitry 18 and/or by accessing programming data stored on storage circuitry 16, from processor(s) 26 as commands based on the operations of wireless circuitry 24, etc.).

In some illustrative configurations, each of paths 70, 72, 74, and 76 may be communicatively coupled to each cell 54 of array 52 (e.g., through outputs and/or inputs of programming circuitry 58 and through programming inputs and/or programming outputs of DAC 50). Based on decoding the address on paths 72 during a write operation, only the appropriate (addressed) cell(s) 54 may store (e.g., latch) the write data on path(s) 70 when the strobe signal is asserted. The stored write data (e.g., programming data) may be used to control the configurable circuit(s) 56 by placing them in the corresponding state(s). Based on decoding the address on paths 72 during a read operation, only the appropriate (addressed) cell 54 may provide the read data on path(s) 78.

Figure 5:
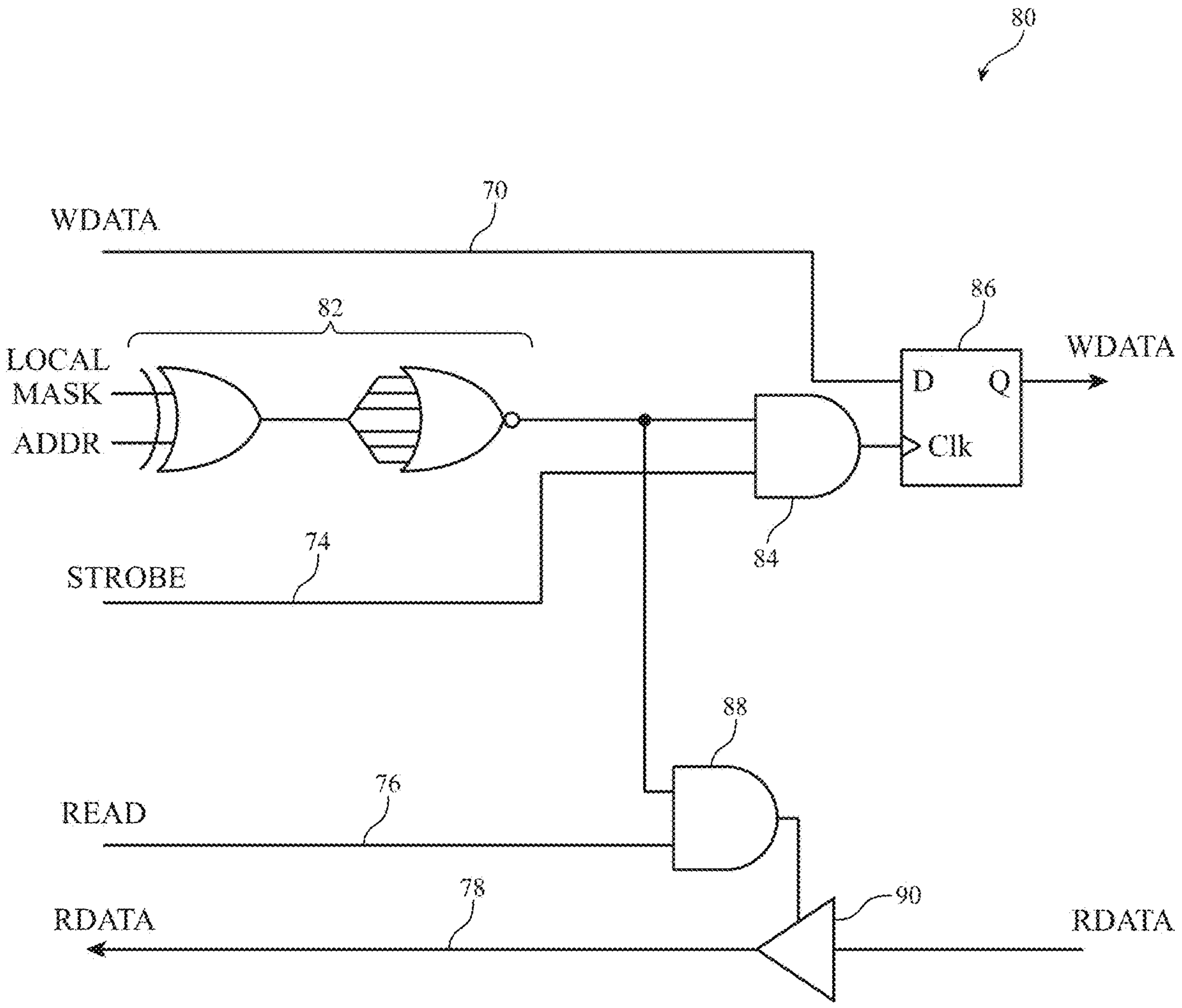
FIG. 5 is a diagram of local address decoding circuitry at a unit cell communicatively coupled to digital-to-analog converter programming circuitry in accordance with some embodiments.

FIG. 5 is a diagram of illustrative address decoding circuitry such as address decoding circuitry 80 implemented at a cell 54 of array 52 (e.g., a corresponding instance of which is implemented at each cell 54 of array 52). Because address decoding circuitry 80 is implemented at cell 54, decoding circuitry 80 may sometimes be referred to as local decoding circuitry or local address decoding circuitry.

Decoding circuitry 80 may determine whether or not the cell 54 in which it is disposed is the cell being addressed (e.g., indicated) by the address on address data paths 72. In particular, decoding circuitry 80 may include a comparison circuit 82. Circuit 82 may receive the address on paths 72 at a first input and compare the address to the local mask (e.g., the locally stored address of the cell in which circuitry 80 is disposed) received at a second input. Based on the comparison, circuit 82 may provide a first binary value (e.g., '1') at its output if the received address matches the local address (mask) and a second binary value (e.g., '0') if there is no match.

An AND logic gate 84 of circuitry 80 may have a first input communicatively coupled to the output of circuit 82 and a second input communicatively coupled to the strobe signal path 74. Based on the strobe signal on path 74 being asserted and based on circuit 82 matching the received address on paths 72 to the local address (and providing the first binary value as output), the output of AND logic gate 84 may provide a first binary value (e.g., '1') and therefore a rising edge to the clock input of latch 86. Accordingly, based on the output of logic gate 84, write data WDATA on path 70 communicatively coupled to input D of latch 86 may be latched (e.g., stored) and provided at output Q.

Stored data WDATA (e.g., programming data) may be used to control the state of the cell 54 (e.g., the state of a configurable circuit 56 in the cell 54). In other words, data storage circuitry (e.g., latch 86) storing the programming data may be communicatively coupled to a configurable circuit 56 (FIG. 3) to program the configurable circuit 56 using the stored programming data (e.g., provided as the control input to the configurable circuit 56). If desired, write data (e.g., programming data) on multiple data paths 70 may be stored by corresponding data storage circuitry (e.g., a plurality of latches, a register, other data store circuitry, etc.) based on the (clock) output signal of AND logic gate 84. The corresponding data storage circuitry may be coupled to different configurable circuits 56 to program the configurable circuits 56 using the different pieces of stored programming data (e.g., provided as the control inputs to the configurable circuits 56).

For a read operation, an AND logic gate 88 of circuitry 80 may have a first input communicatively coupled to the output of circuit 82 and a second input communicatively coupled to the read flag data path 76. Based on the read flag on path 76 being set (asserted) and based on circuit 82 matching the received address on paths 72 to the local address (and providing the first binary value as output), the output of AND logic gate 88 may provide a first binary (logic high) value (e.g., '1') to tristate buffer 90. When placed in the logic high state, read data may be passed from within the cell 54 onto read data path 78 for output (e.g., to programming circuitry 58). The use of the tristate buffer 90 (e.g., when buffer 90 is placed in a high impedance state when the cell is not being addressed) allows other cells to be read using the same path 78 (e.g., by placing the other tristate buffers in the high impedance state).

Figure 6:
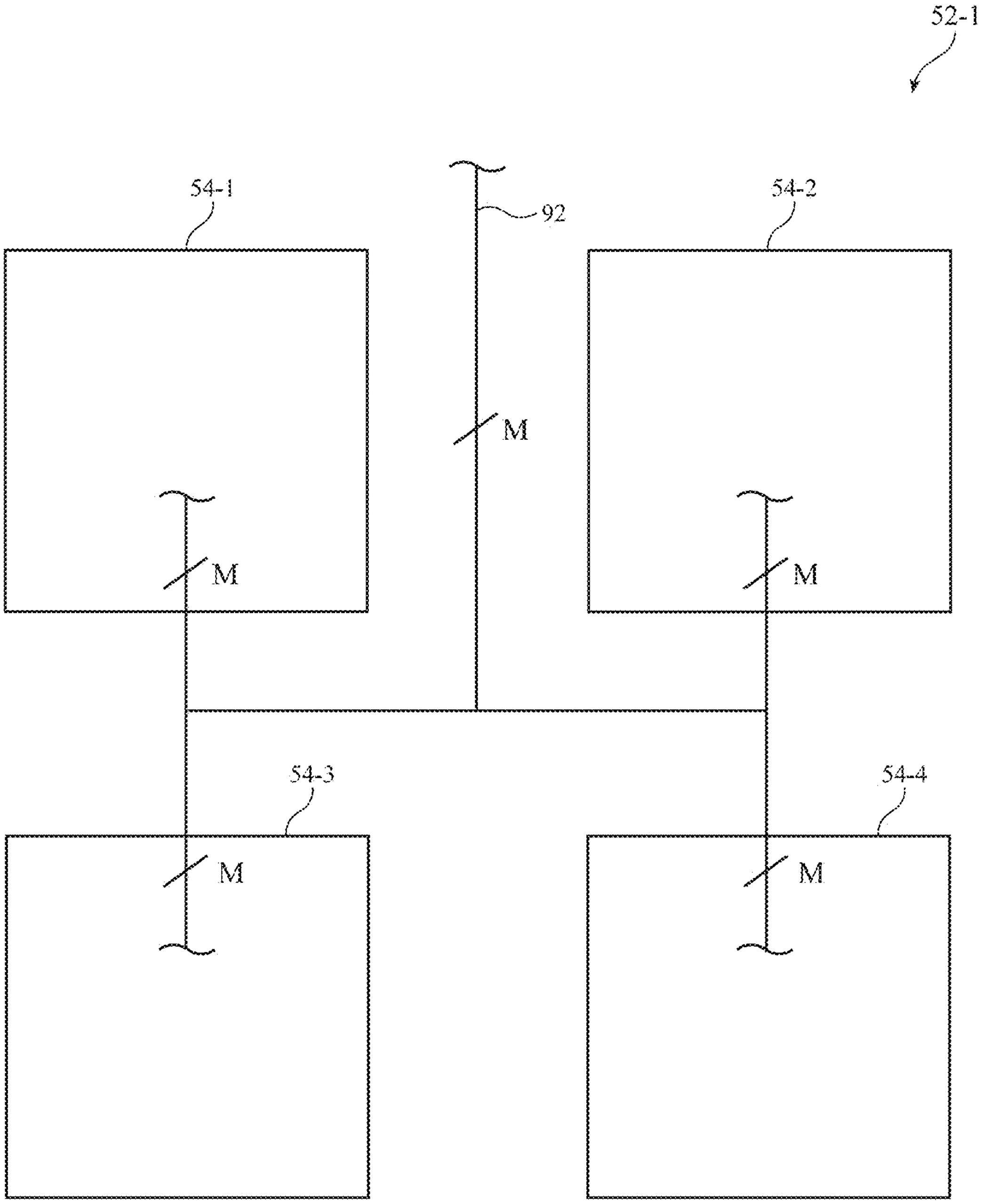
FIG. 6 is a diagram of illustrative digital-to-analog converter cells containing local address decoding circuitry in accordance with some embodiments.

An illustrative portion 52-1 of unit cells in array 52 is shown in FIG. 6. Configurations in which cells in array 52 are provided in a fractal arrangement are sometimes described herein as illustrative examples (e.g., in connection with FIGS. 6 and 7). However, if desired, cells in array 52 may be provided in a matrix cell arrangement or other suitable arrangements, and the embodiments described herein (e.g., in connection with FIGS. 3-9) may similarly apply to these arrangements.

In the example of FIG. 6, each unit cell in portion 52-1 may have local address decoding circuitry such as circuitry 80 in FIG. 5. Programming circuitry 58 (FIG. 4) may provide a set of data paths 92 (e.g., including write data path(s) 70, address data paths 72, strobe signal path 74, read flag data path 76, and read data path(s) 78) to one or more unit cells 54-1, one or more unit cells 54-2, one or more unit cells 54-3, and one or more unit cells 54-4 in portion 52-1.

In particular, when paths 92 are routed to (e.g., are entering) portion 52-1 of unit cells, paths 92 may have a width of M bits (e.g., be a M-bit wide set of paths, or a M-bit data bus). Even when distributed to (e.g., when routed to, when entering) each of unit cells 54-1, 54-2, 54-3, and 54-4, the width of paths 92 may remain the same. Moreover, each set of unit cell(s) 54-1 may represent multiple unit cells therein and paths 92 having bit width M may further be distributed to each unit cell in the set of unit cells 54-1. Accordingly, if desired, using this routing scheme, the same set of data paths 92 having the same width may run between and communicatively couple programming circuitry 58 and each unit cell 54-1 in portion 52-1. In an illustrative configuration in which portion 52-1 shown in FIG. 6 is the entirety of array 52, the same set of data paths 92 having the same bit width M may run between and communicatively couple programming circuitry 58 and each unit cell 54 in array 52.

Using this routing scheme, the local address decoding circuitry of each unit cell 54 in portion 52-1 may be configured to receive and handle the set of data paths 92, or more specifically to receive and decode the entirety (e.g., all bits) of the address in the address data paths of data paths 92. As described in connection with FIG. 5, comparison circuit 82 may receive all bits of the address (e.g., provided by programming circuitry 58) on corresponding address data paths 72 and the local mask (e.g., the stored local address) may have the same number of bits as the address.

Figure 7:
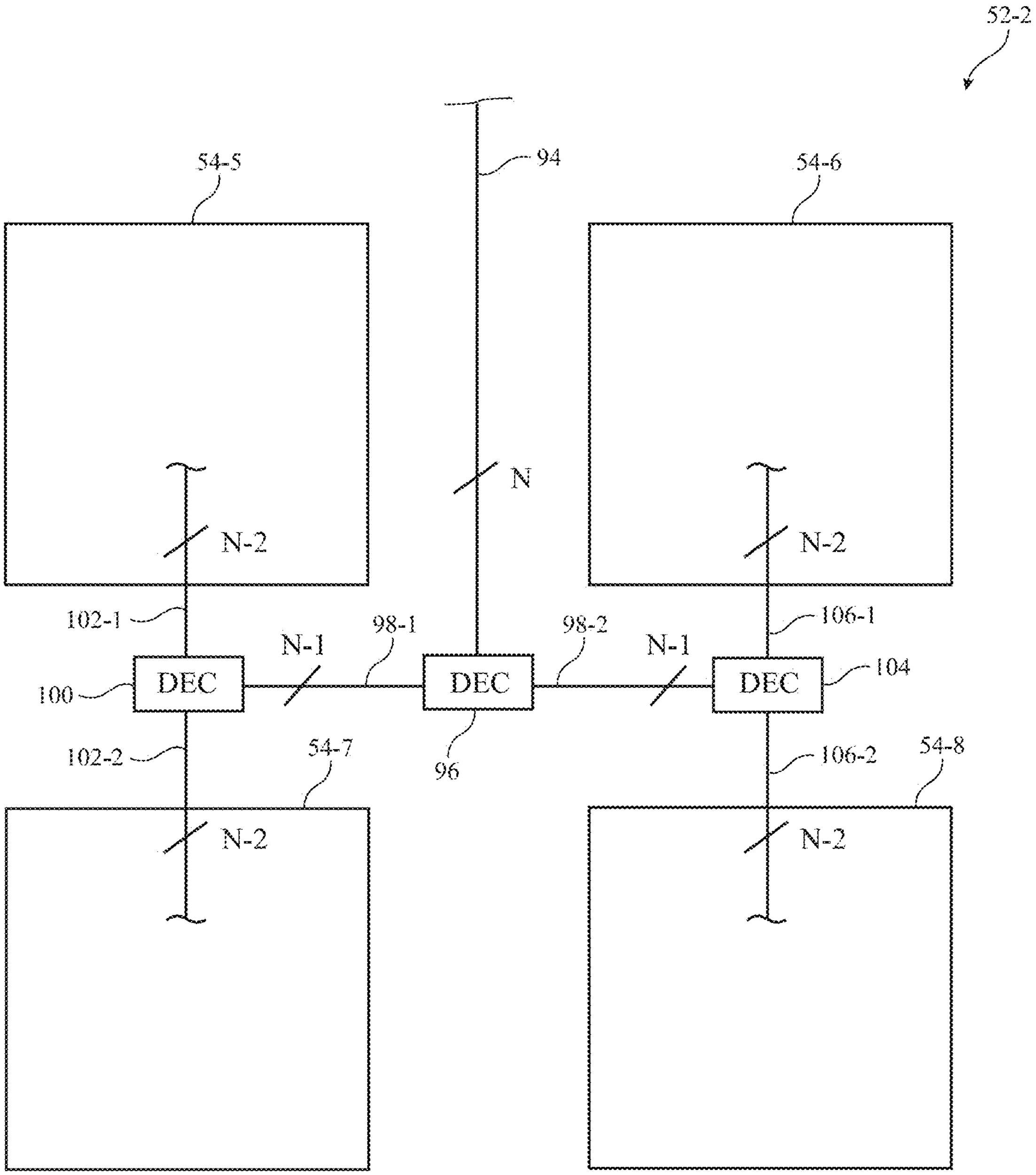
FIG. 7 is a diagram of illustrative digital-to-analog converter cells communicatively coupled to shared address decoding circuitry in accordance with some embodiments.

While providing routing paths for write data (e.g., programming data), a strobe signal, and an address (and if desired, for a read flag and read data) can reduce the number of routing paths needed (when compared to providing individual programming path(s) to each cell of the array), it may be desirable to further reduce number of the routing paths, e.g., at least for routing to a portion of the cells. FIG. 7 is a diagram of an illustrative portion 52-2 of unit cells in array 52 having shared address decoding circuitry that can reduce the number of lower-level routing paths (e.g., branches of routing paths further away from original set of entering routing paths 94). In the example of FIG. 7, a portion of address decoding may occur at shared address decoding circuitry (e.g., address decoding circuitry 96, 100, and 104 communicatively coupled to paths 94) prior to all of the paths 94 reaching each unit cell in portion 52-2 shown in FIG. 7.

In particular, programming circuitry 58 (FIG. 4) may provide a set of data paths 94 (e.g., including write data path(s) 70, address data paths 72, strobe signal path 74, read flag data path 76, and read data path(s) 78) to one or more unit cells 54-5, one or more unit cells 54-6, one or more unit cells 54-7, and one or more unit cells 54-8 in portion 52-2. When paths 94 are routed to (e.g., are entering) portion 52-2 of unit cells, paths 94 may have a width of N bits (e.g., be a N-bit wide set of paths, or a N-bit data bus).

After being routed to portion 52-2 of unit cells, paths 94 may first be received by address decoding circuitry 96. In other words, paths 94 may be communicatively coupled to decoding circuitry 96. Address decoding circuitry 96 may process (e.g., resolve, perform decoding for, etc.) a first bit (e.g., the most significant bit) of the address data bits on the address data paths 72 in paths 94. In particular, decoding circuitry 96 may determine, based on the (most significant) bit of the address, whether the addressed cell is on the left side of array portion 52-2 (e.g., a cell in the set of cell(s) 54-5 or in the set of cell(s) 54-7) or on the right side of array portion 52-2 (e.g., a cell in the set of cell(s) 54-6 or in the set of cell(s) 54-8).

In response to the addressed cell being on the left side, the remaining signals on paths 94 (e.g., other than the resolved bit of the address) may be passed to paths 98-1. In response to the addressed cell being on the right side, the remaining signals on paths 94 (e.g., other than the resolved bit of the address) may be passed to paths 98-2. By decoding circuitry 96 narrowing down the location of the address cell using the information in the (most significant) bit of the address on a corresponding address data path of paths 94, the corresponding address data path no longer needs to be routed past decoding circuitry 96 to identify the addressed cell. Accordingly, the set of paths 98-1 and the set of paths 98-2 may each have a width of (N−1) bits, with the address data path having the bit resolved by decoding circuitry 96 absent from both sets of paths.

Paths 98-1 may be coupled between decoding circuitry 96 and decoding circuitry 100. Address decoding circuitry 100 may process (e.g., resolve, perform decoding for, etc.) a second bit (e.g., the second-most significant bit) of the original address data bits on address data paths 72 of paths 94 (or the most significant bit of the address data bits on address data paths 72 of paths 98-1). In particular, decoding circuitry 100 may determine, based on the (second-most significant) bit of the original address, whether the addressed cell is a cell in the set of cell(s) 54-5 (e.g., in the right side branch of cells from the perspective of circuitry 100) or is a cell in the set of cell(s) 54-7 (e.g., in the right side branch of cells from the perspective of circuitry 100).

In response to the addressed cell being in the set of cell(s) 54-5, the remaining signals on paths 98-1 (e.g., other than the bit of the address resolved by circuitry 100) may be passed to paths 102-1. In response to the addressed cell being in the set of cell(s) 54-7, the remaining signals on paths 98-1 (e.g., other than the bit of the address resolved by circuitry 100) may be passed to paths 102-2. By decoding circuitry 100 narrowing down the location of the address cell using the information in the (second-most significant) bit of the original address on a corresponding address data path of paths 98-1, the corresponding address data path no longer needs to be routed past decoding circuitry 100 to identify the addressed cell. Accordingly, the set of paths 102-1 and the set of paths 102-2 may each have a width of (N−2) bits, with the address data path having the additional (second-most significant) bit of the original address resolved by decoding circuitry 100 absent from both sets of paths.

In an analogous manner to that described above for the left side of portion 52-2 and decoding circuitry 100, corresponding data received on paths 98-2 may be similarly processed by decoding circuitry 104 (e.g., by decoding the second-most significant bit of the original address). Accordingly, the set of paths 106-1 and the set of paths 106-2 may each have a width of (N−2) bits, lacking the two address data paths 72 of paths 94 containing address bits (e.g., the most and second-most significant address bits) that were decoded by decoding circuitry 96 and 104.

If desired, this type of shared decoding scheme may continue until the last two sets of paths branching out from the last shared address decoding circuitry (shared between only two cells). These last two sets of paths may lack any address data paths, as all of the address bits have been decoded by all of the upstream shared address decoding circuitry. This scenario may be illustrated by paths 94 having only two address bits on two corresponding address data paths 72 of paths 94. Accordingly, paths 102-1 (and similarly, paths 102-2, paths 106-1, and paths 106-2) may lack any address data paths 72 (but include the other data paths such as write data path(s) 70, strobe signal path 74, read flag data path 76, and read data path(s) 78). If desired, when using this completely shared address decoding scheme, the local address decoding circuitry (e.g., implemented using circuitry 80 in FIG. 5) may omit comparison circuit 82, AND logic gate 84, and AND logic gate 88, may connect strobe signal path 74 to the clock input of latch 86, and may connect read flag data path 78 to the control input of buffer 90.

Figure 8:
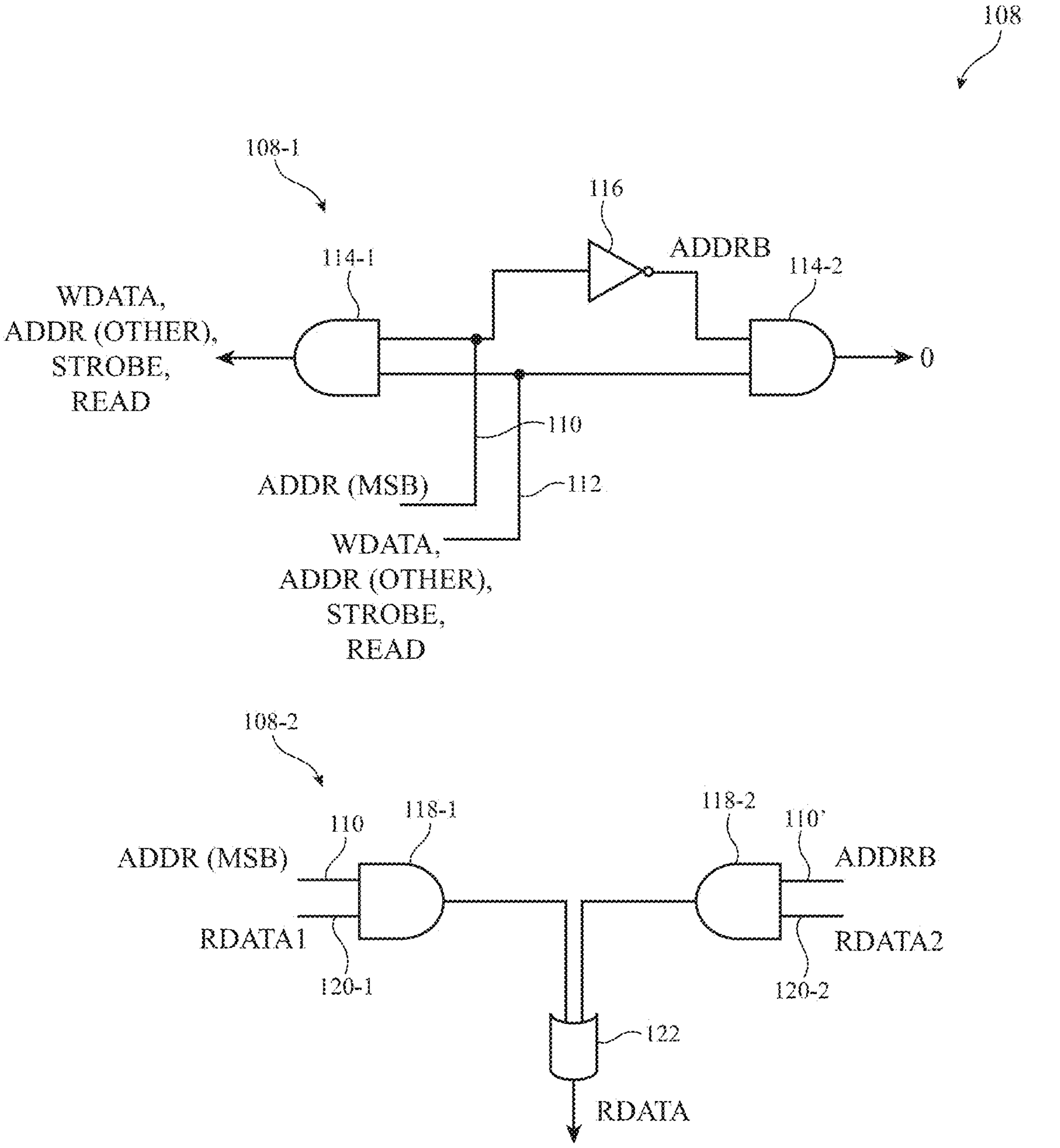
FIG. 8 is a diagram of illustrative shared address decoding circuitry at a split between cells in accordance with some embodiments.

FIG. 8 is a diagram of illustrative shared address decoding circuitry 108 (e.g., a corresponding instance of which can be implemented at each branching out of routing paths). As examples in connection with FIG. 7, an instance of circuitry 108 may be implemented at the branching out of paths 94 into paths 98-1 and 98-2 (as decoding circuitry 96), an instance of circuitry 108 may be implemented at the branching out of paths 98-1 into paths 102-1 and 102-2 (as decoding circuitry 100), an instance of circuitry 108 may be implemented at the branching out of paths 98-2 into paths 106-1 and 106-2 (as decoding circuitry 104), etc.

In the example of FIG. 8, two illustrative types of decoding circuits 108-1 and 108-2 are shown. Decoding circuit 108-1 may be used to decode a given bit of the address (e.g., the most significant bit of the received address bits) for routing the write data, the other (e.g., remaining) address bits of the address, the strobe signal, and the read flag past decoding circuitry 108. In particular, path 110 providing the address bit to be decoded may be coupled to a first input of AND logic gate 114-1 and coupled, via an intervening inverter 116, to a first input of AND logic gate 114-2. Inverter 116 may provide the first input of AND logic gate 114-2 with bit ADDRB, which is an inverted version of the address bit on path 110. The other data bit (e.g., a bit of write data, another address bit, the strobe signal bit, the read flag bit) may be provided on path 112 coupled to the second input of AND logic gate 114-1 and coupled to the second input of AND logic gate 114-2.

Accordingly, depending on the value of the address bit being resolved, the other data bit on path 112 will be output by one of AND logic gate 114-1 or AND logic gate 114-2, and the other one of AND logic gate 114-1 or AND logic gate 114-2 will output a fixed binary value (e.g., ‘0’). In the example of FIG. 8, AND logic gate 114-1 outputs (e.g., passes) the value on path 112 and AND logic gate 114-2 outputs (e.g., passes) the fixed binary value.

In the example of FIG. 8, paths 110 and 112 may be coupled to or may be part of the paths prior to branching out, while the outputs of logic gates 114-1 and 114-2 may be coupled to the branched out paths.

If desired, multiple instances of decoding circuit 108-1 may be provided to appropriately process each of the other bits that should pass circuitry 108 (e.g., all bit(s) of write data, all unresolved address bits, the strobe signal bit, the read flag bit). If desired, inverter 116 may be shared between the multiple instances of circuit 108-1.

If desired, a single instance of decoding circuit 108-1 may be used to determine the output or pass-through path and the remaining other bits may be passed along paths parallel to (e.g., in the same direction as) the determined output or pass-through path without themselves being directly gated by logic gates 114-1, 114-2, and 116.

Decoding circuit 108-2 may be used to decode a given bit of the address (e.g., the most significant bit of the received address bits) for routing the read data from the unit cell to programing circuitry 58. In particular, path 110 providing the address bit to be decoded may be coupled to a first input of AND logic gate 118-1. Path 110' providing an inverted version of the address bit to be decoded (e.g., bit ADDRB provided by inverter 116) may be coupled to a first input of AND logic gate 118-2. Path 120-1 from a first branched off path (e.g., for providing read data from a first set of cells) may be coupled to the second input of AND logic gate 118-1. Path 120-2 from a second branched off path (e.g., for providing read data from a second set of cells) may be coupled to the second input of AND logic gate 118-2. The outputs of logic gates 118-1 and 118-2 may be coupled to corresponding inputs of OR logic gate 122. Configured in this manner, when the appropriate AND gate 118-1 or 118-2 (e.g., on the side containing the addressed cell) outputs or passes the read data bit (RDATA1 or RDATA2), which is passed through OR logic gate 122 and provided at the output of OR gate logic 122 (e.g., as RDATA).

In the example of FIG. 8, path 110 and the output of OR logic gate 122 may be coupled to the paths prior to branching out, while paths 120-1 and 120-2 may be coupled to the branched out paths.

In connection with an example described with FIG. 6, address decoding may occur entirely (e.g., for all address bits) at local address decoding circuitry (e.g., circuitry 80 in FIG. 5). In connection with an example described with FIG. 7, address decoding may occur entirely (e.g., for all address bits) at shared address decoding circuitry (e.g., circuitry 108 in FIG. 8). If desired, a combination (e.g., a hybrid) of these two address decoding schemes may be used.

Figure 9:
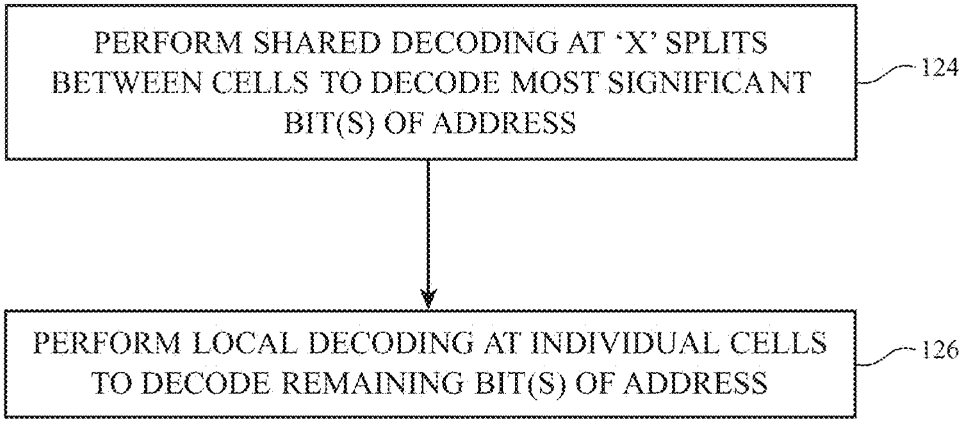
FIG. 9 is a flowchart of illustrative operations for performing shared and local address decoding for a digital-to-analog converter in accordance with some embodiments.

As shown in the illustrative flowchart of FIG. 9, illustrative DAC 50 may include one or more instances of shared address decoding circuitry (e.g., instance(s) of decoding circuitry 108) that perform, at block 124, shared decoding at a corresponding number of (e.g., 'X' number of) splits to decode a set of most significant bit(s) of the address for the other data (e.g., bit(s) of write data, un-resolved address bit(s), the strobe signal bit, the read flag bit, and bit(s) of read data). The illustrative DAC 50 may also include local address decoding circuitry at each cell 54 (e.g., instance(s) of decoding circuitry 80) that perform, at block 126, local decoding (e.g., at the cell-level) to decode the remaining bit(s) (e.g., the least significant bit(s)) of the address to appropriately process the other data (e.g., bit(s) of write data, un-resolved address bit(s), the strobe signal bit, the read flag bit, and bit(s) of read data).

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer-readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Wireless communications circuitry comprising:

a digital-to-analog converter having a plurality of unit cells;

programming circuitry configured to program the plurality of unit cells; and a plurality of data paths coupled to the programming circuitry and to the digital-to-analog converter and including address data paths, wherein the programming circuitry is configured to convey, over the address data paths and to the digital-to-analog converter, address bits that collectively form an address identifying a given unit cell in the plurality of unit cells.

2. The wireless communications circuitry of claim 1, wherein the plurality of data paths include a programming data path and wherein the programming circuitry is configured to convey, over the programming data path and to the plurality of unit cells, programming data to be stored at the given unit cell.

3. The wireless communications circuitry of claim 2, wherein the plurality of data paths include a strobe signal path and wherein the programming circuitry is configured to convey, over the strobe signal path and to the plurality of unit cells, a strobe signal that, when asserted, causes the programming data to be stored at the given unit cell.

4. The wireless communications circuitry of claim 2, wherein the given unit cell has a configurable circuit and wherein the programming data, when stored at the given unit cell, causes the configurable circuit to exhibit a state.

5. The wireless communications circuitry of claim 1, wherein the plurality of data paths include a read flag data path and wherein the programming circuitry is configured to convey, over the read flag data path and to the plurality of unit cells, a read flag that, when set, causes data to be read from the given unit cell.

6. The wireless communications circuitry of claim 5, wherein the plurality of data paths include a read data path and wherein the programming circuitry is configured to receive, over the read data path and from the given unit cell, the data being read when the read flag is set.

7. The wireless communications circuitry of claim 1, wherein the given unit cell includes local address decoding circuitry configured to receive and decode at least one address bit of the address bits.

8. The wireless communications circuitry of claim 7, wherein the local address decoding circuitry is configured to receive and decode each address bit of the address bits.

9. The wireless communications circuitry of claim 1, wherein the digital-to-analog converter includes shared address decoding circuitry coupled to a first set of unit cells in the plurality of unit cells and coupled to a second set of unit cells in the plurality of unit cells and wherein the shared address decoding circuitry is configured to receive and decode at least one address bit of the address bits.

10. The wireless communications circuitry of claim 9, wherein the given unit cell includes local address decoding circuitry configured to receive and decode at least one address bit of the address bits.

11. The wireless communications circuitry of claim 10, wherein the shared address decoding circuitry is configured to receive and decode at least a most significant bit of the address and wherein the local address decoding circuitry is configured to receive and decode at least a least significant bit of the address.

12. The wireless communications circuitry of claim 1 further comprising a transmitter that includes the digital-to-analog converter.

13. A digital-to-analog converter comprising:

a plurality of unit cells, a given unit cell in the plurality of unit cells having a programmable feature and a storage circuit configured to store programming data for the programmable feature;

a plurality of address data paths coupled to the plurality of unit cells and configured to convey an address for the given unit cell;

a strobe signal path coupled to the plurality of unit cells and configured to convey a strobe signal; and a write data path coupled to the plurality of unit cells and configured to provide the programming data to the storage circuit based on the address and the strobe signal.

14. The digital-to-analog converter of claim 13 further comprising:

a read flag data path coupled to the plurality of unit cells and configured to convey a read flag; and a read data path coupled to the plurality of unit cells and configured to provide data from the given unit cell based on the address and the read flag.

15. The digital-to-analog converter of claim 13, wherein the given unit cell has a local address and includes a comparison circuit configured to perform a comparison of the address conveyed by the plurality of address data paths with the local address and wherein the write data path is configured to provide the programming data to the storage circuit based on the comparison.

16. The digital-to-analog converter of claim 13 further comprising:

shared address decoding circuitry coupled between the plurality of address data paths and the plurality of unit cells, wherein the shared address decoding circuitry is configured to decode an address bit of the address conveyed on an address data path of the plurality of address data paths.

17. The digital-to-analog converter of claim 16 further comprising:

additional shared address decoding circuitry coupled between the plurality of address data paths and the plurality of unit cells, wherein the additional shared address decoding circuitry is configured to decode an additional address bit of the address conveyed on an additional address data path of the plurality of address data paths.

18. The digital-to-analog converter of claim 13 further comprising:

an input configured to receive digital data; and an output configured to provide an analog voltage corresponding to the digital data using the plurality of unit cells.

19. A digital-to-analog converter comprising:

a plurality of unit cells each having a configurable circuit;

an input coupled to the plurality of unit cells and configured to receive digital data;

an output coupled to the plurality of unit cells and configured to provide an analog voltage corresponding to the digital data using the plurality of unit cells; and a plurality of programming inputs coupled to the plurality of unit cells and configured to receive an address and programming data for controlling the configurable circuit of a unit cell in the plurality of unit cells identified by the address.

20. The digital-to-analog converter of claim 19 further comprising:

first address decoding circuitry coupled between first and second sets of unit cells in the plurality of unit cells and configured to provide address decoding for a first part of the address and for the first and second sets of unit cells, wherein the unit cell identified by the address includes second address decoding circuitry configured to provide address decoding for a second part of the address and for the unit cell.

* * * * *